United States Patent [19]

Van Gerwen et al.

[11] 4,130,806
[45] Dec. 19, 1978

[54] FILTER AND DEMODULATION ARRANGEMENT

[75] Inventors: Petrus J. Van Gerwen; Rudolf A. Van Doorn; Wilfred A. M. Snijders; Hendrik A. Van Essen, all of Eindhoven, Netherlands

[73] Assignee: U.S. Philips Corporation, New York, N.Y.

[21] Appl. No.: 799,884

[22] Filed: May 23, 1977

[30] Foreign Application Priority Data

May 28, 1976 [NL] Netherlands ............... 7605726

[51] Int. Cl.² ............................................. H04B 1/16
[52] U.S. Cl. .................................... 325/487; 325/324; 178/88; 329/50
[58] Field of Search .............. 325/42, 44, 323, 324, 325/487; 178/88; 364/724; 329/50, 104; 328/167

[56] References Cited

U.S. PATENT DOCUMENTS

| | | | |
|---|---|---|---|
| 3,493,876 | 2/1970 | Zimmerman | 329/50 |
| 3,525,541 | 8/1970 | Gooding | 325/324 |
| 3,753,115 | 8/1973 | Van Gerwen et al. | 325/323 |
| 3,971,996 | 7/1976 | Motley et al. | 329/50 |

Primary Examiner—Robert L. Richardson
Assistant Examiner—Jin F. Ng
Attorney, Agent, or Firm—Thomas A. Briody; William J. Streeter; Henry I. Steckler

[57] ABSTRACT

A digital filter and demodulation arrangement for passband signals, whose corresponding baseband signal has a bandwidth limited to a given maximum frequency. The passband signals are filtered according to two bandpass characteristics which, apart from their asymmetrical distortion relative to their central frequency, are versions from one another shifted 90° in phase. The filtered passband signals are demodulated with an in-phase carrier and a quadrature carrier and the demodulated signals are combined to a baseband signal.

In the digital filtering process the sampling frequency is reduced from a value higher than twice the highest frequency in the passband signals to a value which is not higher than twice said maximum frequency in the baseband signal and in the digital demodulation and combination processes the reduced sampling frequency is also used so that a considerable reduction in the internal processing speed is obtained.

1 Claim, 2 Drawing Figures

FILTER AND DEMODULATION ARRANGEMENT

BACKGROUND OF THE INVENTION (1) Field of the Invention

The invention relates to filtering and demodulating passband signals obtained by modulating a carrier in accordance with an information-carrying baseband signal whose band-width is limited to a given maximum frequency.

In the transmission of information by electromagnetic means modulation of a carrier is often used at the transmitter end for obtaining a passband signal which is properly adapted to the properties of the transmission path. At the receiving end the signal derived from the transmission path is demodulated after unwanted signal components originating from the transmission path have been suppressed by means of a bandpass filter (the so-called premodulation filter). Unwanted signal components which are produced in the demodulation process are often suppressed by means of a low-pass filter (the so-called post modulation filter).

The invention results from investigations in the field of a 2400 Baud AM-modem for data signal transmission but is not limited thereto as the same principles can be used for other data rates, for information-carrying signals of another kind and for other modulation methods such as VSB, PSK and QAM. Although this 2400 Baud AM-modem will be discussed hereinafter this should not be interpreted as a limitation of the range of application of the principles according to the invention.

(2) Description of the Prior Art

U.S. Pat. No. 3,753,115 discloses an arrangement for filtering and demodulating passband signals obtained by modulating a carrier in accordance with a baseband signal whose bandwidth is limited to a given maximum frequency, which arrangement is provided with means for filtering the passband signals according to a first and a second passband characteristic for generating first and second filtered passband signals, which passband characteristics, apart from their asymmetrical distortion relative to their central frequency, are versions from one another, shifted 90° in phase, means for demodulating the first and second filtered passband signals with an in-phase carrier and a quadrature carrier respectively for generating first and second demodulated signals, and means for combining the first and the second demodulated signals. In particular, the use of two transversal premodulation filters and two analog modulators eliminates the influence of that distortion in the transfer characteristic of this premodulation filters which is caused by a limitation of the duration of the impulse response of these filters and which is asymmetrical relative to the central frequency of these filters; in addition it accomplishes that no post-modulation filter is required.

The structure of this prior art arrangement is of a hybid nature, that is to say that in the transversal filters use is indeed made of digital delay elements but that otherwise analog circuit components are used, such as resistors, for the weighting networks wherein the filter coefficients are fixed, and analog modulators. A drawback of this hybrid structure is the fact that once such an arrangement is fully integrated in one semiconductor body it is difficult to modify given parameters, such as filter characteristics, so that the arrangement is not programmable. Another drawback of this hybrid structure is the fact that for a proper correction of the influence of the asymmetrical distortion in the transfer characteristic of the premodulation filter high requirements are imposed on the modulators as regards d.c.-offset and other imperfections which are difficult to avoid in analog circuits whereas it is not possible to use digital modulators behind the filters without additional ADC circuits.

Summary of the Invention

It is an object of the invention to provide a fully digital implementation of a filter and demodulation arrangement of the type mentioned, wherein the influence of asymmetrical distortion in the transfer characteristic of the premodulation filter owing to limitation of the duration of its impulse response is eliminated and no post-modulation filter is required and wherein, furthermore, a lowest possible internal processing speed is realized.

The filter and demodulation arrangement according to the invention is characterized in that all means for filtering, demodulating and combining are digital means, the digital filter means are, furthermore, provided with means for sampling frequency reduction for converting signal samples of the passband signals occurring with a first sampling frequency which is higher than twice the highest frequency in the passband signals, into signal samples of the first and second filtered passband signals occurring with a second sampling frequency which is not higher than twice said maximum frequency of the baseband signal, and the digital means for demodulating and combining are arranged for processing signal samples occurring with the same second sampling frequency.

In this manner a digital filter and demodulation arrangement is obtained which is very suitable for full integration in one semiconductor body. On the other hand, by performing the storage of the filter coefficients separately an arrangement can be easily obtained which is programmable, that is to say that after integration given parameters can be modified in a manner which is known per se. Furthermore, the drawbacks which are associated with analog demodulators are obviated by the digital implementation of the demodulation means.

Short Description of the Drawing

The invention and its advantages will be further explained with reference to the drawing, in which.

References

M. Bellanger et al., "Digital filtering of bandlimited signals: Interpolation, extrapolation and distortions due to various truncations. Reduction of computation speed in digital filters." IEEE — ICC June 11–13, 1973, pages 23-11 to 23-15.

L. R. Rabiner et al., "Terminology in digital signal processing," IEEE Trans. Audio Electroacoust, Vol. AU-20, No. 5, December 1972, pages 322–337.

R. W. Schafer et al., "A digital signal processing approach to interpolation", Proc. IEEE, Vol. 61, No. 6, June 1973, pages 692–702.

List of Abbreviations

Am—"amplitude modulation"

ADC—"analog-to-digital conversion"
DAC—"digital-to-analog conversion"
PSK—"phase shift keying"
QAM—"quadrature amplitude modulation"
VSB—"vestigial sideband."

Description of the Embodiments (1) General Description

Figure 1:
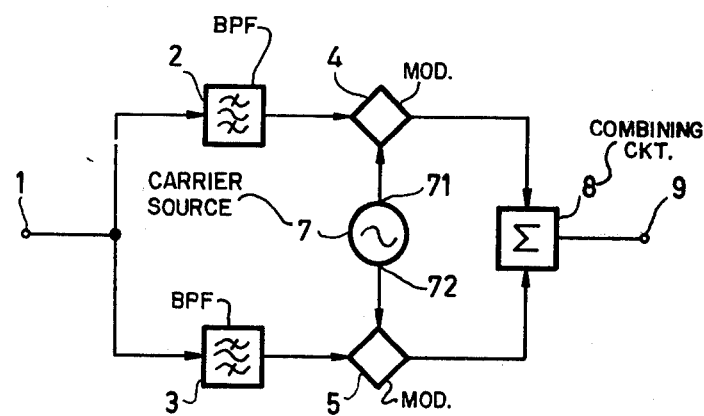
FIG. 1 is a block diagram of a filter and demodulation arrangement according to the above-mentioned prior art.

FIG. 1 shows the block diagram of a prior art arrangement for filtering and coherently demodulating a passband signal which is transmitted via a transmission path. The signal derived from a transmission path appears at a common input 1 of two bandpass filters 2 and 3. The filtered passband signal at the output of filter 2 is demodulated in modulator 4 by means of an in-phase carrier which is available at an output 71 of a local carrier source 7. Likewise the filtered passband signal at the output of filter 3 is demodulated in modulator 5 by means of a quadrature carrier which is available at an output 72 of carrier source 7. The demodulated signals at the output of modulators 4 and 5 are added in a linear combination circuit 8.

U.S. Pat. No. 3,753,115 proves that, by means of a special relation between the transfer characteristics of filters 2 and 3, at output 9 of combination circuit 8 that filtered information-carrying baseband signal is immediately available that has been used at the transmitter end of the transmission path for modulating an in-phase carrier for obtaining the passband signal. In that case no post modulation filter is required to suppress unwanted frequency components and, in addition, the influence of that distortion in the amplitude characteristic $A_B(\omega)$ of filter 2 is eliminated that is caused by limitation of the duration of the impulse response of filter 2 and that is asymmetrical relative to the central frequency $\omega_m$ of filter 2, as the amplitude characteristic $A_B(\omega)$ of filter 3 has an opposite asymmetrical distortion. From the mathematical explanation given in said patent specification it follows that the desired relation is automatically obtained when the impulse responses $h_2(t)$ and $h_3(t)$ of bandpass filters 2 and 3 satisfy the equations:

$$h_2(t) = h_L(t) \cos \omega_m t \qquad (1)$$

$$h_3(t) = h_L(t) \sin \omega_m t \qquad (2)$$

wherein $h_L(t)$ is the impulse response of a given bandpass filter.

It is simple to prove mathematically that a passband signal which is obtained at the transmitter end by modulating a quadrature carrier in accordance with an information-carrying baseband signal, can be filtered and demodulated at the receiver end by means of the arrangement of FIG. 1 by feeding modulator 4 with the quadrature carrier at output 72 of carrier source 7 and by feeding modulator 5 with the in-phase carrier at output 71 of carrier source 7 and by furthermore subtracting the output signals of modulators 4 and 5 from one another in combination circuit 8.

With QAM signals the amplitudes of an in-phase carrier and a quadrature carrier of the same frequency are simultaneously modulated at the receiver end. By making a double version of the arrangement of FIG. 1 wherein filters 2 and 3 are used jointly, both the baseband signal carried by the in-phase carrier and the baseband signal carried by the quadrature carrier can be recovered in the manner explained above.

A disadvantage of an analog implementation of the arrangement of FIG. 1 is the fact that the elimination of asymmetrical distortions in the transfer characteristics of filters 2 and 3 are based on a compensation technique and, consequently, imposes high requirements on modulators 4 and 5 as regards dc-offset and other imperfections which are difficult to avoid in analog circuits. A further disadvantage, also with a hybrid construction according to the above-mentioned patent specification is the fact that, once such an arrangement is implemented completely integrated in one or more semiconductor bodies, certain parameters such as filter characteristics are hard to modify so that the arrangement can not be programmed. These drawbacks can be obviated by a digital implementation of the arrangement of FIG. 1.

A first digital embodiment can be obtained by connecting in FIG. 1 before input 1 an ADC circuit and after output 9 a DAC circuit and by furthermore replacing the component parts such as filters 2 and 3, modulators 4 and 5, carrier source 7 and linear combination circuit 8 by their digital equivalents which are known per se. This direct translation from analog-to-digital implementation would, however, lead to a digital arrangement in which all component parts process signal samples occurring with a sampling frequency which, in accordance with the known sampling theorem is equal to at least twice the highest frequency in the signals to be processed, which, in this case, would mean twice the highest frequency in the signal applied to input 1. The number of processing operations per unit of time and, consequently, the required computation speed of the digital arrangement directly depends on the sampling frequency of the signal samples. For realizing the arrangement as an integrated circuit in one or more semiconductor bodies or for the realization by means of a so-called micro-processor it is of the utmost importance that the required computation speed is reduced to the lowest possible values. In the digital embodiment of the filter and demodulation arrangement, whose block diagram is shown in FIG. 2, a considerable reduction in the internal processing speed in comparison with the first digital embodiment above explained is obtained by using the measures according to the invention.

Figure 2:
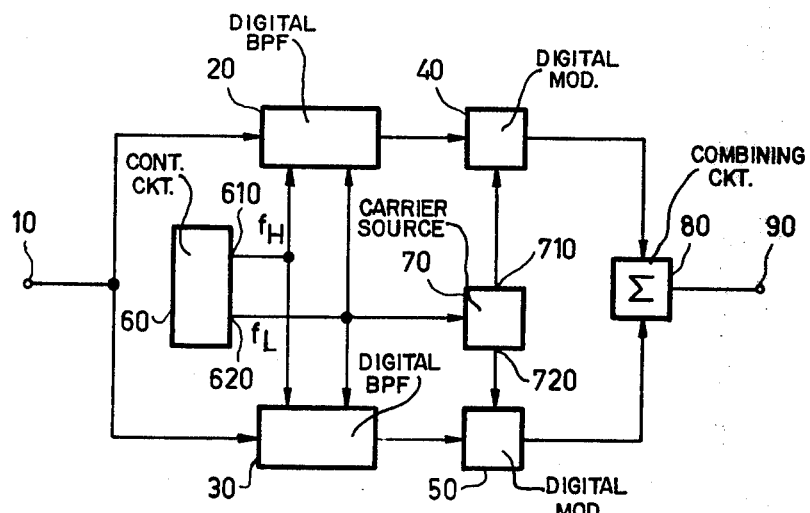
FIG. 2 is a block diagram of a digital filter and demodulation arrangement according to the invention.

In FIG. 2 the ADC circuit at the input and the DAC circuit at the output are not shown because the arrangement is also suitable for applications in which the passband signal is already available in digital form or in which the recovered baseband signal is required in digital form. In prevailing cases these circuits may be added in known manner.

To a digital input 10 of the arrangement in FIG. 2 a digital signal is applied having a sampling frequency $f_H = 1/T_H$ which is equal to at least twice the highest frequency in the equivalent analog signal which is derived from the transmission path. Input 10 is connected to two interpolating digital filters 20 and 30 which are controlled by a control circuit 60. This control circuit 60 has an output 610 at which a control signal having a frequency $f_H$ is available and an output 620 at which a control signal having a frequency $f_L$ is available, wherein $f_L = 1/T_L$ is equal to at least twice the highest frequency in the equivalent analog baseband signal. There is a rational proportion between the frequencies $f_H$ and $f_L$. Digital filters 20 and 30 are bandpass filters and have digital impulse responses $h_{20}(nT_H)$ and $h_{30}(nT_H)$ which are given by the equations:

$$h_{20}(nT_H) = h_L(nT_H) \cos(n\omega_m T_H) \qquad (3)$$

$$h_{30}(nT_H) = h_L(nT_H) \sin(n\omega_m T_H), \quad (4)$$

wherein $h_L(nT_H)$ is the impulse response of a given digital low-pass filter and $\omega_m$ the central frequency of filters 20 and 30. The digital output signal of filter 20 is multiplied in a digital modulator 40 by a digital-in-phase carrier which is available at an output 710 of a digital carrier source 70. Likewise the digital output signal of filter 30 is multiplied in a digital modulator 50 by a digital quadrature carrier which is available at an output 720 of digital carrier source 70. Carrier source 70 is controlled by control circuit 60. The digital output signals of modulators 40 and 50 are added in a digital linear combination circuit 80 so that at an output 90 of combination circuit 80 a filtered and demodulated digital signal is obtained whose equivalent analog signal corresponds to the required baseband signal.

(2) Operation of the arrangement in FIG. 2

For the description of the operation of the arrangement in FIG. 2 it is now assumed by way of example that from the transmission path an analog signal is derived which is formed by a passband signal in the frequency band from 200 to 3200 Hz and by noise or other kinds of interferences whose frequency spectrum is limited to a frequency band from 0 to 7200 Hz by means of a simple analog filter, not further shown. This passband signal may, for example, be derived from a transmitter wherein the amplitude of an inphase carrier having a frequency of 1700 Hz is modulated by a 2400 Baud data signal whose frequency spectrum is first limited to a maximum frequency of 1500 Hz. By means of the filter and demodulation arrangement this baseband data signal should be recovered from the passband signal and noise and other kinds of interferences in the frequency bands from 0 to 200 Hz and from 3200 to 7200 Hz should be suppressed as much as possible. The highest frequency in the analog signal derived from the transmission path amounts to 7200 Hz so that on the basis of the sampling theorem this signal can be unambiguously converted into a digital signal having a sampling frequency $f_H = 14.4$ kHz by means of an ADC circuit. This digital signal is applied to both digital filters 20 and 30 which have a passband from 200 to 3200 Hz. By means of equations (3) and (4) the impulse responses of these filters can be derived from the impulse response $h_L(nT_H)$ of a digital low-pass filter having a bandwidth of 1500 Hz by choosing $\omega_m/2\pi$ equal to 1700 Hz. After the digital filter and demodulation processing operations the baseband data signal is available in digital form at output 90.

As known this 2400 Baud data signal can be unambiguously represented by a digital signal having a sampling frequency $f_L = 2.4$ kHz. This means that in combination circuit 80 an addition of the signal samples at the output of digital modulators 40 and 50 need be performed every 1/2400 sec. only. As the output signals of these modulators at any sampling instant only depend on the input signals available at that instant because the modulators have no memory properties, both digital modulators 40, 50 and their digital carrier source 70 can be arranged for processing digital signals having a sampling frequency $f_L = 2.4$ kHz instead of a sampling frequency $f_H = 14.4$ kHz. To this end modulators 40, 50 and carrier source 70 are connected to output 620 of control circuit 60 instead of to output 610. This means a saving in the number of computational processes per unit of time and consequently a reduction in the internal processing rate, although this reduction, considered relatively, is not very large because the largest part of the computational processes per unit of time takes place in digital filters 20 and 30.

A considerably more important saving in the number of computational processes per unit of time is obtained because this sampling frequency reduction can be extended to the inner part of both digital filters 20 and 30 because these filters now only need supply signal samples having a sampling frequency $f_L = 2.4$ kHz to the two digital modulators 40 and 50. To this end these digital filters 20 and 30 are constructed as interpolating digital filters having an input sampling frequency $f_H = 14.4$ kHz and an output sampling frequency $f_L = 2.4$ kHz. Such filters are known per se and it may suffice here to refer to the references listed under (D). An attractive implementation of an interpolating digital filter is described in U.S. Pat. No. 3,997,773, to which reference is made here also. This implementation enables the realization of any interpolating digital filter with a rational interpolation factor $f_H/f_L$. The use of interpolating digital filters in the arrangement of FIG. 2 causes a considerably greater reduction in the internal processing speed than the sampling frequency reduction in the digital modulators because in the filters a considerably greater number of computational processes takes place per unit of time than in the modulators.

Owing to the reduction accomplished in the internal processing speed in the digital filter and demodulation arrangement the possibility is created to perform all multiplication processes which are required for filtering and demodulation by means of only one digital multiplier. All multiplications which are required for computing a given signal sample at the output of the arrangement are successively performed by this single digital multiplier in a manner known to those skilled in the art.

What is claimed is:

1. An arrangement for filtering and demodulating passband signals which are obtained by modulating a carrier in accordance with a baseband signal whose bandwidth is limited to a given maximum frequency, said arrangement comprising means for filtering the passband signals according to a first and a second bandpass characteristic for generating first and second filtered passband signals, which bandpass characteristics apart from the asymmetrical distortion relative to their central frequency are versions of one another shifted 90° in phase, means for demodulating the first and second filtered passband signals with an inphase carrier and a quadrature carrier respectively for generating first and second demodulated signals, means for combining the first and second demodulated signals, all said means for filtering, demodulating and combining being digital means, the digital filter means including means for sampling frequency reduction for converting signal samples of the passband signals occurring with a first sampling frequency which is higher than twice the highest frequency in the passband signals into signal samples of the first and second filtered passband signals occurring with a second sampling frequency which is not higher than twice said maximum frequency of the baseband signal, and the digital means for demodulating and combining each include means for processing signal samples occurring with the same second sampling frequency.

* * * * *

UNITED STATES PATENT OFFICE
CERTIFICATE OF CORRECTION

Patent No. 4,130,806  Dated December 19, 1978

Inventor(s) Petrus J. Van Gerwen et al

It is certified that error appears in the above-identified patent and that said Letters Patent are hereby corrected as shown below:

Col 6 Line 48, Before "asymmetrical" delete "apart from the" and insert -- having --

Col 6 Line 49, After "frequency" insert -- and --

Col 6 Line 51 Before "carrier" delete "inphase" and insert -- in phase --

Signed and Sealed this

Twenty-seventh Day of January 1981

[SEAL]

Attest:

RENE D. TEGTMEYER

Attesting Officer  Acting Commissioner of Patents and Trademarks